United States Patent [19]
Wilmot

[11] Patent Number: 5,903,431
[45] Date of Patent: May 11, 1999

[54] MULTIPLE SINGLE LAYER MONOLITHIC PASSIVE INTEGRATED CIRCUITS AND METHOD

[75] Inventor: Daniel J. Wilmot, Arvada, Colo.

[73] Assignee: Vari-L Company, Inc., Denver, Colo.

[21] Appl. No.: 08/757,293

[22] Filed: Nov. 27, 1996

[51] Int. Cl.⁶ .................................................. H01G 4/06
[52] U.S. Cl. ........................ 361/311; 361/328; 361/321.5
[58] Field of Search ............................. 361/301.1, 301.2, 361/301.4, 303–305, 306.1, 306.2, 306.3, 307–313, 321.1–321.5, 320, 328

[56] References Cited

U.S. PATENT DOCUMENTS

| | | | |
|---|---|---|---|
| 4,306,274 | 12/1981 | Yamagiwa et al. . | |
| 4,356,530 | 10/1982 | Sato et al. ................................. | 361/307 |
| 4,410,867 | 10/1983 | Arcidiacono et al. ................... | 333/172 |
| 4,737,744 | 4/1988 | Hayward et al. ........................ | 333/168 |
| 5,367,430 | 11/1994 | DeVoe et al. . | |
| 5,414,589 | 5/1995 | Amano et al. ........................ | 361/306.3 |
| 5,757,076 | 5/1998 | Kambara ................................. | 257/724 |

FOREIGN PATENT DOCUMENTS

| | | | |
|---|---|---|---|
| 1469944 | 4/1977 | United Kingdom .................... | 361/303 |

*Primary Examiner*—Kristine Kincaid
*Assistant Examiner*—Anthony Dinkins
*Attorney, Agent, or Firm*—Ancel W. Lewis, Jr.

[57] ABSTRACT

Integrated circuits and the method of making same are disclosed which are suitable for use in integrated circuits such as amplifiers, filters and oscillators. Each integrated circuit includes using a main dielectric body that has a thin conductive layer on opposite faces, using conventional etching process to etch out selected spaces or gaps in the layers according to a preselected pattern and cutting through the body to form oblong shaped bodies that form the integrated circuit. These circuits have conductive plates and spaces between plates on both sides with opposite plates providing capacitors connected mechanically and electrically and square shaped sections connected between plates of selected conductive materials which function as resistors and inductors.

14 Claims, 7 Drawing Sheets

MULTIPLE SINGLE LAYER MONOLITHIC PASSIVE INTEGRATED CIRCUITS AND METHOD

TECHNICAL FIELD

This invention relates to integrated circuits and more particularly to passive integrated circuits particularly suited for RF and microwave use and the method of making same.

Background Art

In the past passive integrated circuits particularly suitable for radio frequency RF and microwave use have included capacitors, inductors, resistors and a combination of each. Such integrated circuits with capacitors have problems of circuit parasitics and a relatively high effective series resistance that places a limit on the Q of the circuit and have had problems of reaching high frequencies as on the order of 6–8 GHz.

Integrated circuits having capacitors and heretofore known as multiple layer ceramic chip caps have opposed, interleaved, parallel plates with a layer of ceramic between the plates serving as a dielectric. Capacitors known as a single layer have a ceramic body with a conductive layer on the top face and a conductive layer on the bottom face.

Yamagiwa et al. U.S. Pat. No. 4,306,274 and DeVoe et al. U.S. Pat. No. 5,367,430 are examples of prior art monolithic passive capacitors but have a different structure and a different method of making from that of the present invention.

Disclosure of the Invention

A multiple single layer monolithic passive integrated circuits and method of making same disclosed includes the steps of providing a main dielectric body with thin flat conductive layers on opposite faces, etching spaces in the layers along preselected spaced lines to form a plurality of plates with spaces between plates and cutting through the body along preselected lines to provide a plurality of identical integrated circuits. Each circuit has a selected plate height and width and a selected gap or spacing between the plates. Resistors and inductors in the form of squared wave shaped strips connected between the plates are provided in a further embodiment.

BRIEF DESCRIPTION OF THE DRAWINGS

Details of this invention are described in connection with the accompanying drawings which like parts bear similar reference numerals in which.

DETAILED DESCRIPTION

Figure 1:
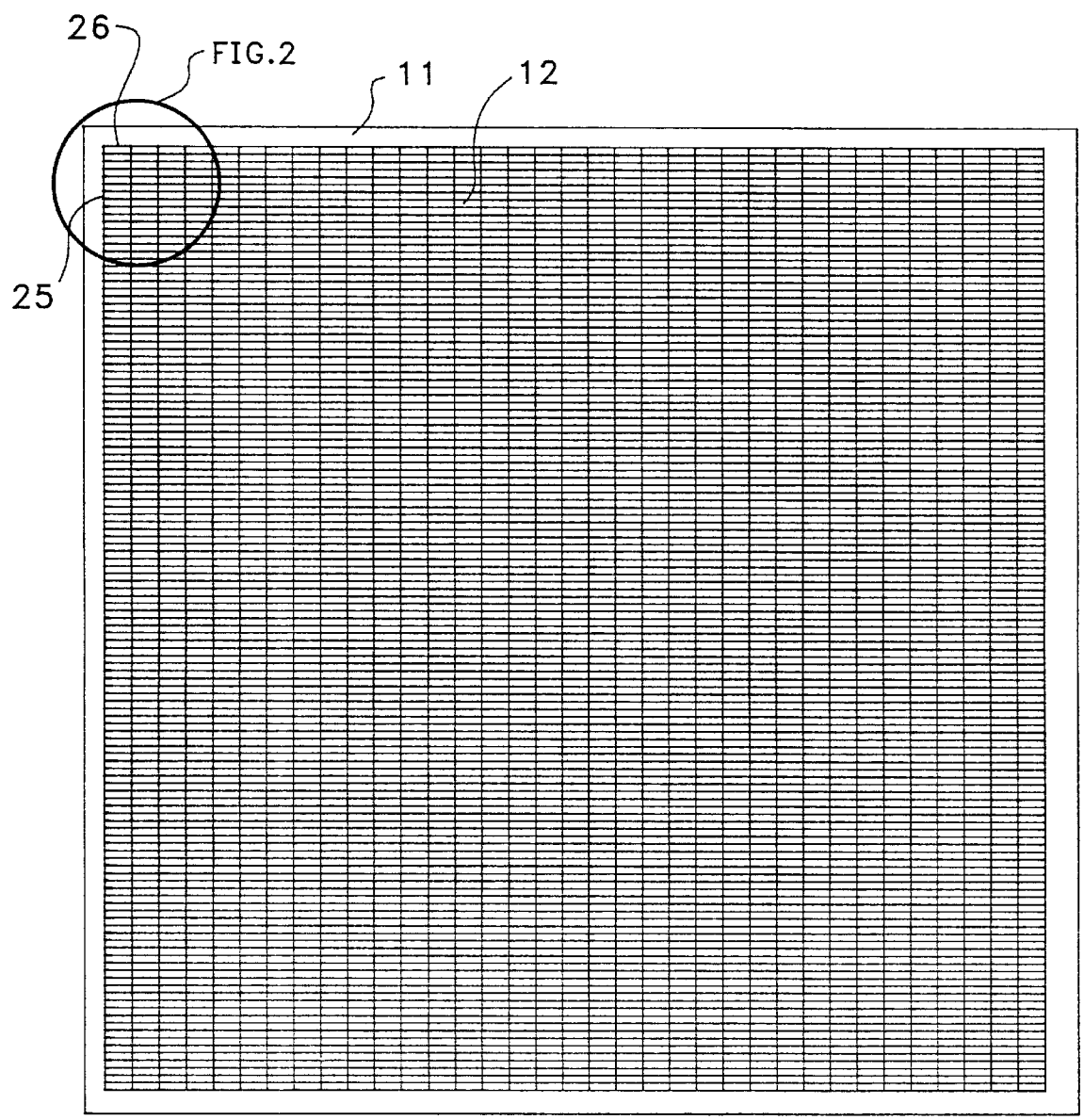
FIG. 1 is a top plan view of a main dielectric body after the etching has been accomplished to in a preselected pattern remove a portion of the top and bottom layers from the main body.

Referring now to FIG. 1 there is shown a flat surfaced, main dielectric body 11 of a rectangular shape having a selected height, width and thickness dimensions. Body 11 preferably is a ceramic body. Initially, the dielectric body 11 is plated on the flat top and bottom surfaces so as to have a thin, conductive top layer 12 and a thin, conductive bottom layer 13 that covers almost the entire surface area of the top and bottom surfaces of body 11.

A conventional thin film process presently used for making integrated circuits is used to form the pattern of interspersed conductive elements and non-conductive gaps described hereinafter. In this process a photoresist material is applied to the conductive top layer 12 and a photoresist material is applied to the conductive bottom layer 13. The top layer 12 is exposed using a pattern or art work of a selected configuration. The bottom layer 13 is exposed using a pattern or art work of a selected configuration. An etching process is applied to the top and bottom layers which is used to remove portions of the conductive layer. In the top layer 12 seen in FIG. 2 there is shown etched out vertical strips or gaps 15, 16 and 17 along parallel, spaced vertical lines of a preselected spacing and along parallel, spaced horizontal lines 18 at equal spacing. A pattern of etched out vertical gaps 15, 16 and 17 along parallel spaced vertical lines is repeated laterally of the dielectric body from left to right to the right side edge of top layer 12.

Figure 6:
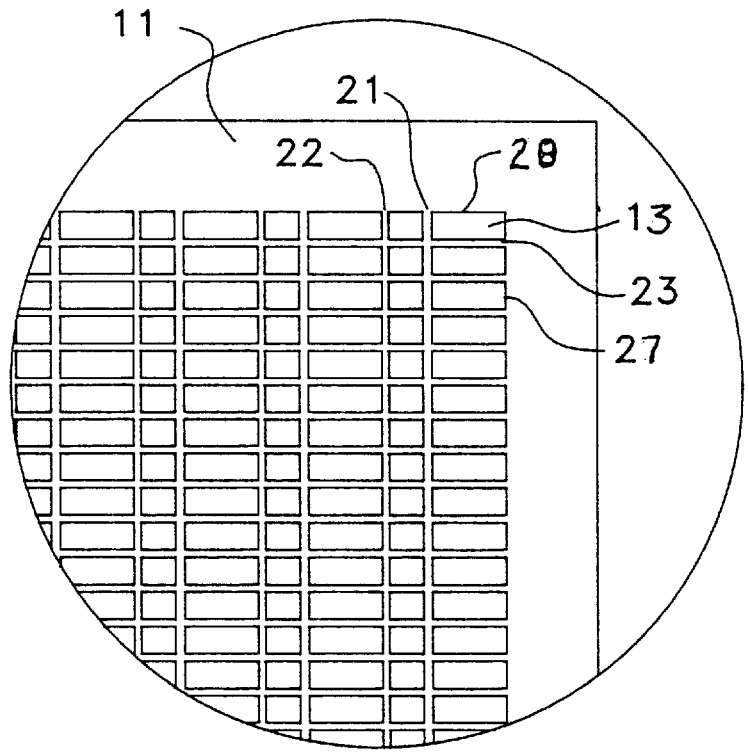
FIG. 6 is an enlarged bottom plan view of a portion of the body within the circle of FIG. 2 showing the opposite bottom face.

In the bottom layer 13 shown in FIG. 6 there is provided etched out vertical gaps 21 and 22 along preselected parallel spaced vertical lines and a plurality of equally spaced etched out horizontal gaps 23. Vertical gap 17 is located directly opposite vertical gap 22. Horizontal gap 18 is located directly opposite horizontal gap 23.

Figure 2:
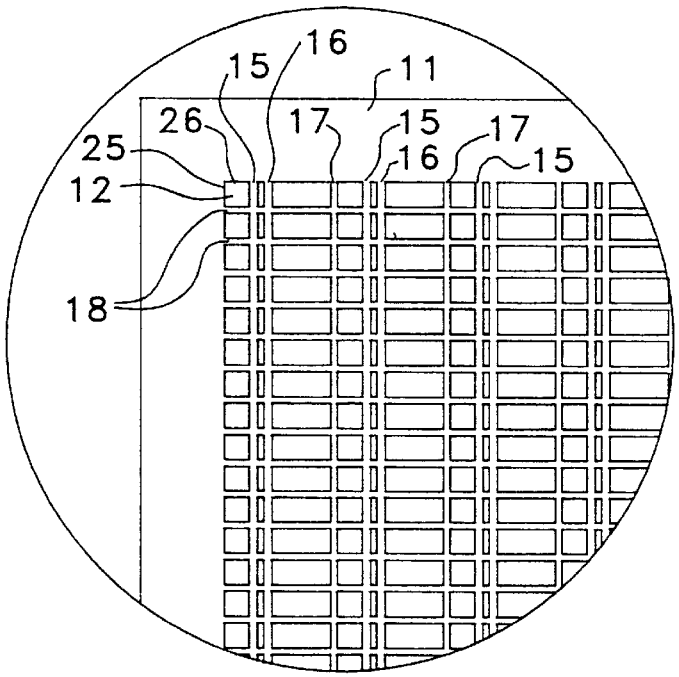
FIG. 2 is an enlarged top plan view of a portion within the circle shown in FIG. 1.

Cuts are then made through the body using a single saw blade. Beginning at the upper left hand corner the top layer 12 as shown in FIG. 2 the first vertical cut by the blade would be along left side edge 25 of the top layer 12 and along the first etched gap 17 proceeding from left to right. The horizontal cut would be along the top edge 26 of the top layer 12 and along the uppermost etched gap 18. With reference to FIG. 6 this vertical cut would be along the right side edge 27 of the bottom layer 13 and along the first etched gap 22 proceeding from left to right. The above described first horizontal cut would be along the top edge 28 of the bottom layer and along the uppermost etched gap 23.

These vertical cuts are repeated through each successive etched gaps 17 and 22 proceeding from left to right in FIG. 2 and the horizontal cuts are repeated through successive etched gaps 18 and 23 from top to bottom.

Figure 3:
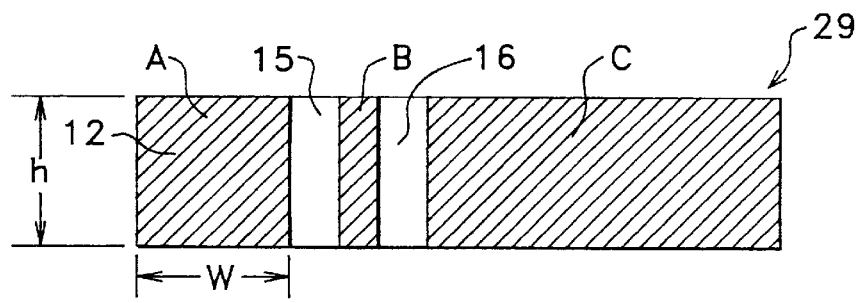
FIG. 3 is an enlarged top plan view of one of the circuits that is cut from FIG. 2 embodying features of the present invention.
Figure 4:
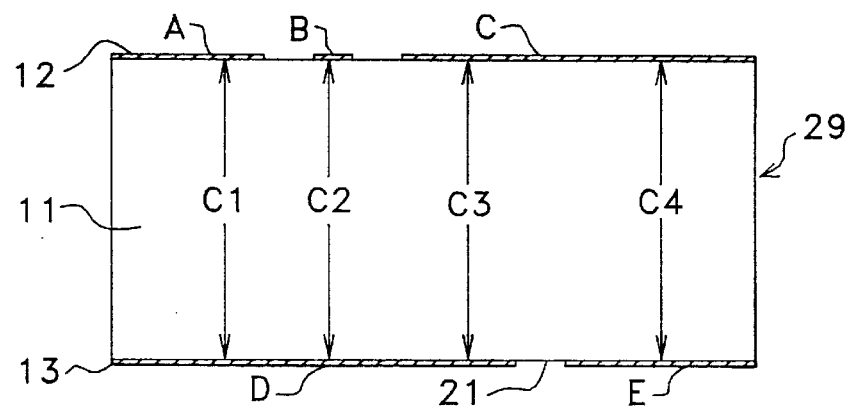
FIG. 4 is a side elevation view of the circuits shown in FIG. 3 with the opposite side being an identical mirror image.
Figure 5:
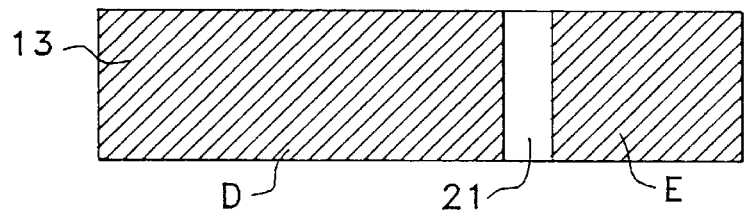
FIG. 5 is an enlarged bottom plan view of the circuit shown in FIG. 3.
Figure 7:
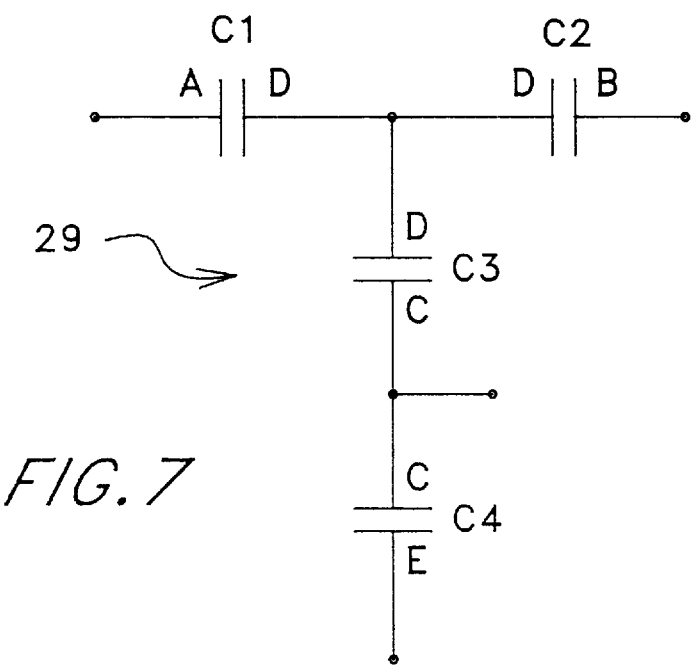
FIG. 7 is a schematic diagram of the circuit shown in FIGS. 3, 4 and 5.
Figure 8:
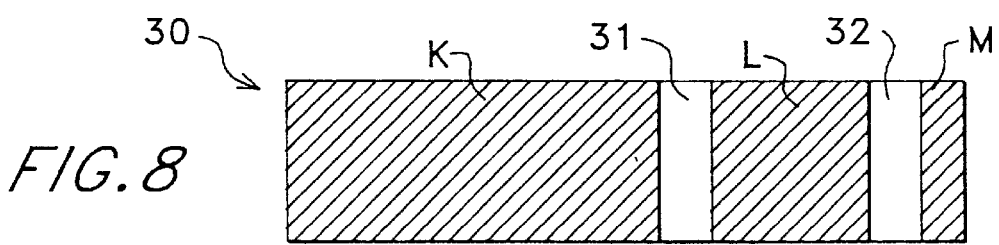
FIG. 8 is a top plan view similar to FIG. 3 of another embodiment of a circuit embodying features of the present invention.
Figure 9:
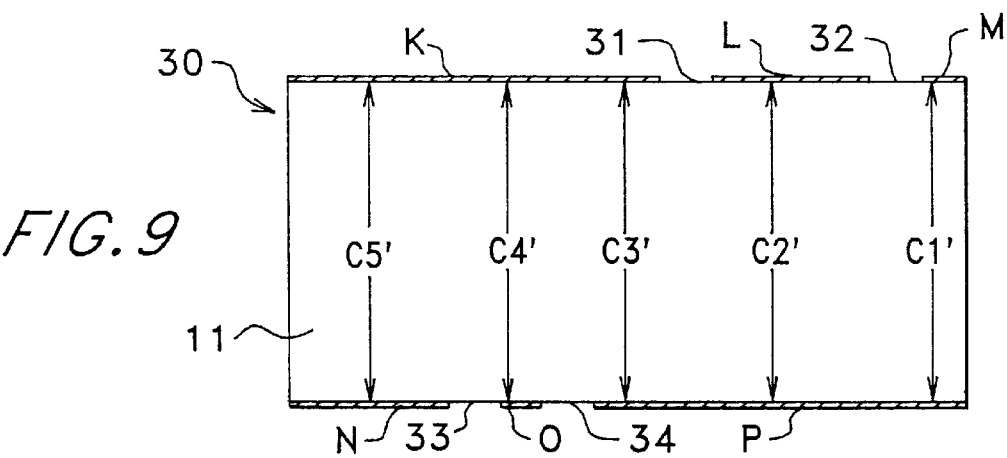
FIG. 9 is a side elevation view of the circuit of FIG. 8.
Figure 10:
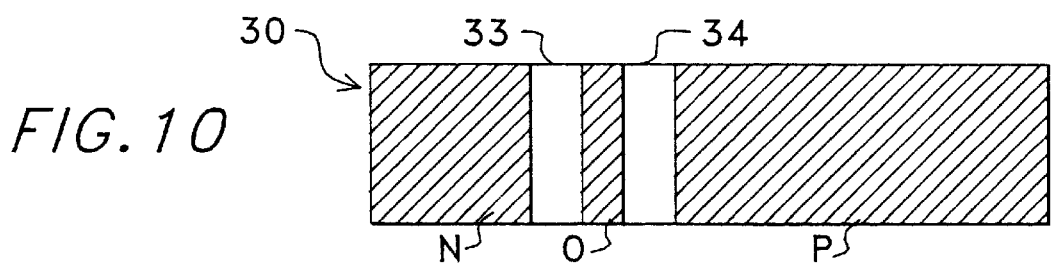
FIG. 10 is a bottom plan view of the circuit of FIG. 8.

Referring now to FIGS. 3–5 each integrated circuit 29 resulting from the above described process is identical. A typical dimension is 30 mil. by 60 mil. Each circuit 29 is in the form of an oblong block having a plate A provided by a portion of the above described top layer 12 of a selected height designated h and width designated w on the top face of an oblong body 11. A plate B of a selected height and selected width is separated from plate A by a strip or gap 15 and a plate C of a selected height and width is separated from plate B by gap 16. Similarly, a plate D is provided by a portion of the above described bottom layer 13 of a selected height and selected width is on the bottom face of body 11 and a plate E of a selected height and selected width is separated from plate D by gap 21. Plates A, B and C are opposite plate D to form capacitors C1, C2 and C3, respectively, and plate C is opposite plate E to form capacitor C4. Thee schematic diagram of circuit 29 is shown in FIG. 7. Circuit 29 is essentially a "T" circuit which includes capacitors C1 and C2 in series with one another in a top leg and capacitor C3 and capacitor C4 in series with one another in a bottom leg. One end of the other leg is connected to a common junction between capacitors C1 and C2 and plate D. Plate C is common to capacitors C3 and C4 at a terminal.

The variables for the above described integrated circuit capacitors and method of making are: 1. to change the thickness of the substrate, 2. change the dielectric constant of the body, 3. change the width of the plate, and 4. change the height of the plate. The capacitors are then mechanically joined by how the cut pattern is selected and electrically joined by selecting the width of the pattern of the layers.

Figure 11:
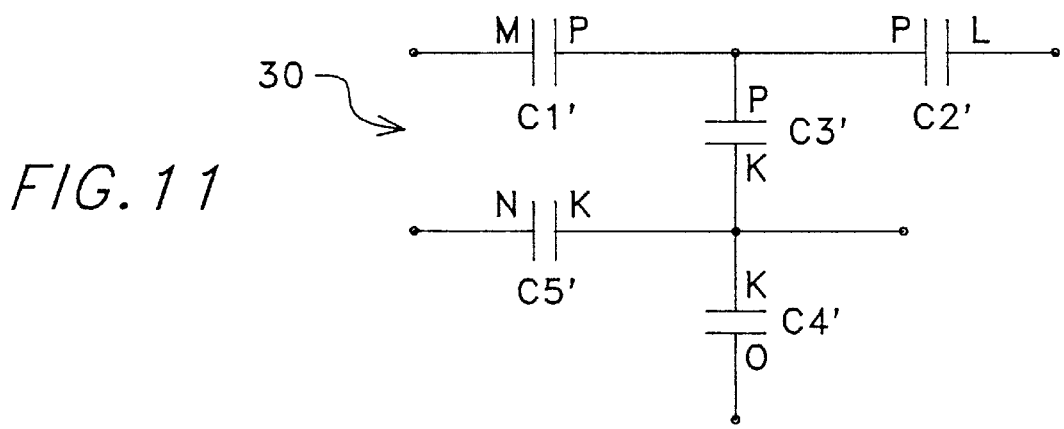
FIG. 11 is a schematic diagram of the circuit shown in FIGS. 8–10.

Referring now to FIGS. 8–11 there is shown another embodiment of an integrated circuit 30 in the form of an oblong block having conductive plates K, L, and M on the top face of an oblong body 11 and conductive plates N, O and P on the bottom face of body 11. There is a gap 31 between plates K and L and a gap 32 between plates L and M. There is a gap 33 between plates N and O and a gap 34 between plates O and P. Plate M is opposite plate B to form capacitor C1', plate L is opposite plate P to form capacitor C2', plate P is opposite plate K to form capacitor C3', plate K is opposite plate O to form capacitor C4' and plate K is opposite plate N to form capacitor C5'. The schematic diagram for circuit 28 is shown in FIG. 11 has capacitors C1', C3' and C5' connected in what is commonly referred to as a "pie" network in that they are connected in a closed loop with a series capacitor C2' and a series capacitor C4' connected at the ends of the "pie" network. A terminal is shown at plate K.

Figure 12:
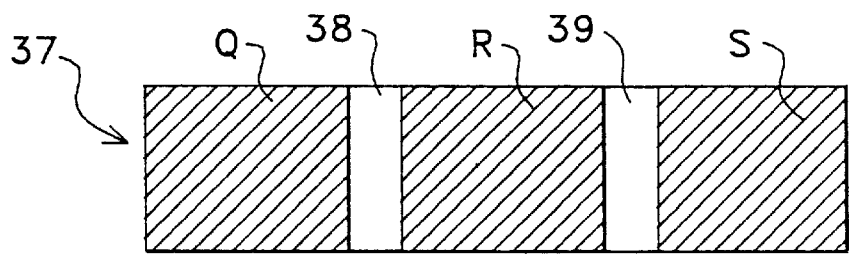
FIG. 12 is a top plan view similar to FIG. 3 of another embodiment of a circuit embodying features of the present invention.
Figure 13:
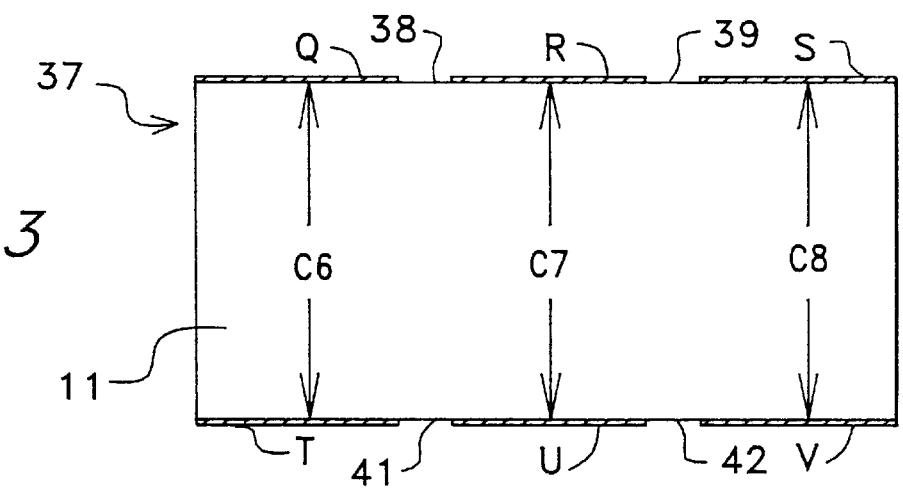
FIG. 13 is a side elevation view of the circuit of FIG. 12.
Figure 14:
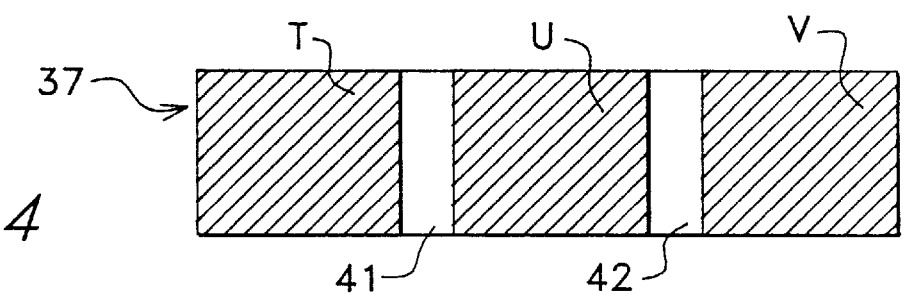
FIG. 14 is a bottom plan view of the circuit of FIG. 12.
Figure 15:
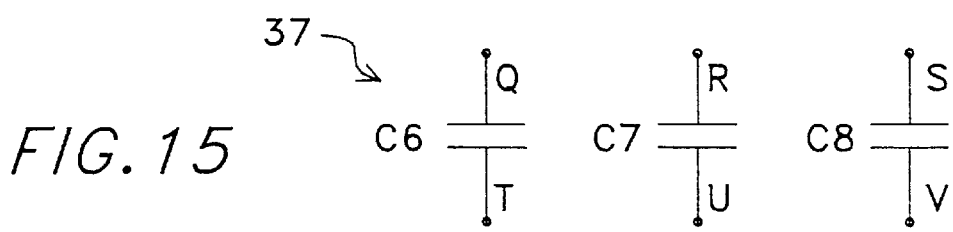
FIG. 15 is a schematic diagram of the circuit of FIGS. 12–14.
Figure 16:
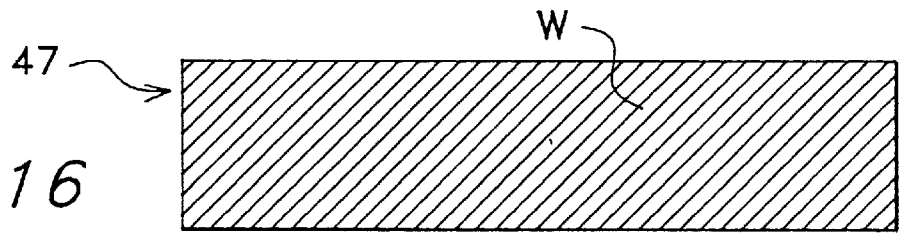
FIG. 16 is a top plan view of yet another embodiment of circuit similar to FIG. 3 embodying features of the present invention.
Figure 17:
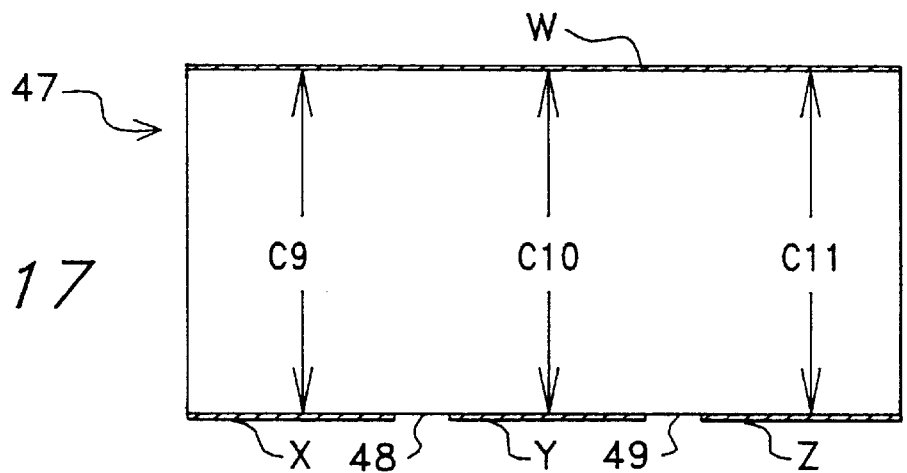
FIG. 17 is a side elevation view of the circuit of FIG. 16.
Figure 18:
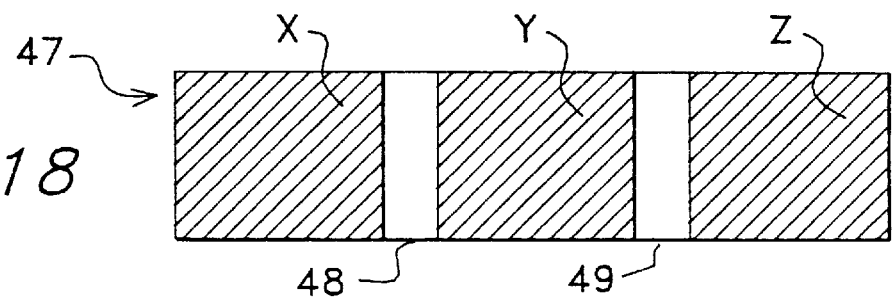
FIG. 18 is a bottom plan view of the circuit of FIG. 16.

Referring now to FIGS. 12–14 there is shown another embodiment of an integrated circuit 37 having top plates Q, R and S on the top face of an oblong body 11 and bottom plates T, U and V on the bottom face of an oblong body 11. There is a gap 38 between plates Q and R and a gap 39 between plates R and S. There is a gap 41 between plates T and U and a gap 42 between plates U and V. These plates are of an equal dimension. Plate Q is opposite plate T, plate R opposite plate U and plate S opposite plate V. The schematic diagram of circuit 37 shown in FIG. 15 has three parallel mechanically connected capacitors that are not electrically connected to one another.

Figure 19:
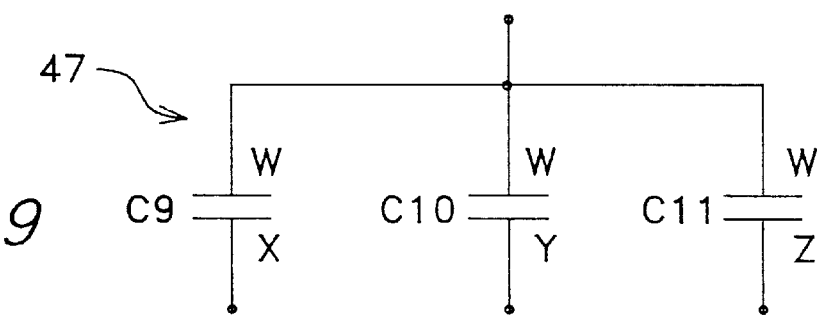
FIG. 19 is a schematic diagram of the circuit of FIGS. 16–18.
Figure 20:
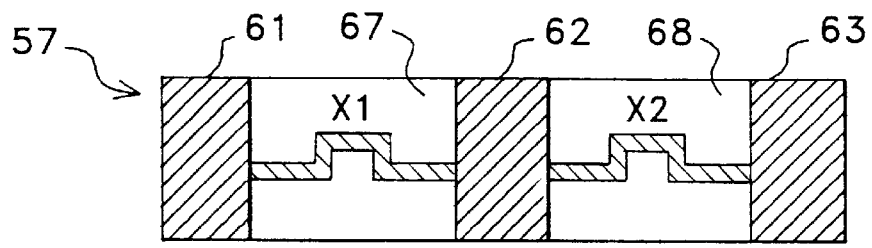
FIG. 20 is a top plan view of yet another embodiment of a circuit embodying features of the present invention.
Figure 21:
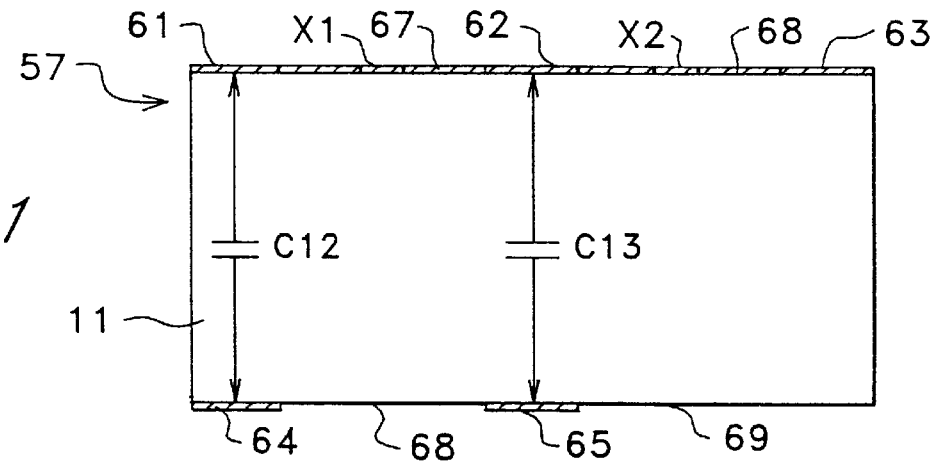
FIG. 21 is a side elevation view of the circuit shown in FIG. 20.
Figure 22:
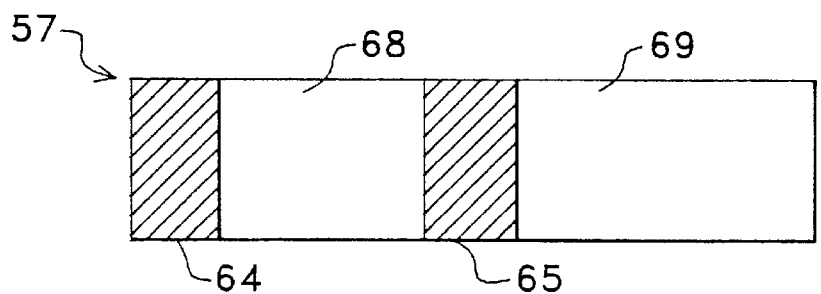
FIG. 22 is a bottom plan view of the circuit shown in FIG. 20.

Referring now to FIGS. 16–19 there is shown another embodiment of integrated circuit 47 having a single top plate W on the top face of an oblong body 11 and three bottom plates X, Y and Z on the bottom surface of an oblong body 11. There is a gap 48 between plates X and Y and a gap 49 between plates Y and Z. Plate W is opposite plate X to form capacitor, plate W is opposite plate Y to form capacitor C10 and plate W is opposite plate Z to form capacitor C11. The schematic diagram for circuit 47 shows three capacitors connected in parallel as is shown in FIG. 19.

Figure 23:
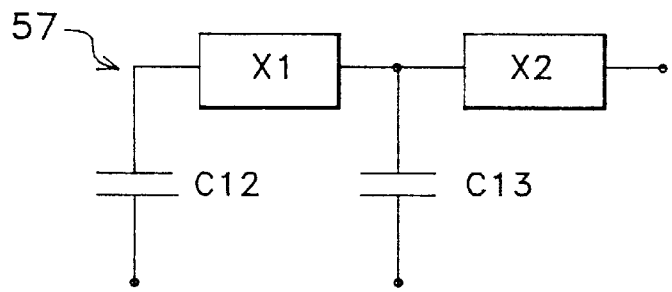
FIG. 23 is a schematic diagram of the circuit of FIGS. 20–22.

Referring now to FIGS. 20–23 there is shown another embodiment of an integrated circuit 57 having both capacitors and impedances. Circuit 57 has conductive top plates 61, 62 and 63 on thee top surface of oblong body 11 and conductive plates 64 and 65 on the bottom face of oblong body 11. There is a space or gap 67 between plates 61 and 62 and a gap 68 between plates 64 and 65 with an open area 69 to the right of bottom plate 65. Plate 63 is opposite plate 64 to form capacitor C12 and plate 62 is opposite plate 65 to form capacitor C13. In addition, there is provided an impedance element X1 connected between plates 61 and 62 and an impedance element X2 connected between plates 62 and 63. The schematic diagram for circuit 57 is shown in FIG. 23 as having a capacitor C12 connected to impedance X1 and capacitor C13 connected between impedances X1 and X2. These impedances may be a resistor by using a high resistance metal such as tantalum nitride (TaN) and an inductor could be formed by using the same shape as the resistor but a low resistance metal such as the same base metal as plate 61. These impedances X1 and X2 are formed by depositing a thin, flat layer of metal in a particular pattern as shown. The shape of the impedances shown are a straight, horizontal section, a raised section that extends up, horizontally and down, and a second straight horizontal section similar to a square wave. It is understood other shapes may be used.

The above described circuits are suited for RF and microwave use and are useful as a filter, amplifier, oscillator and the like. The advantages over the prior art are summarized as:

1. Tighter tolerance ±0.05
2. Lower effective series resistance ESR
3. Multiple parts monolithically joined into one part
4. Higher operating frequencies of 6–8 GHz as to 4 GHz of prior art
5. Reduction of parasitic stray capacitance
6. Reduction in cost of about 6–8 to one per unit Although the present invention has been described with a certain degree of particularity, it is understood that the present disclosure has been made by way of example and that changes in details of structure may be made without departing from the spirit thereof.

What is claimed is:

1. An integrated circuit having pre-selected multiple integrated circuit elements comprising:

a single dielectric body having a selected shape, length, and width, a plurality of thin, conductive first plates on a first face of said body, each said first plates being of a selected width and a selected height with a gap of a selected width between adjacent of each of said first plates, a plurality of thin, conductive second plates on an opposite second face of said body, said second face being spaced from and parallel to said first face, each said second plate being of a selected width and a selected length with a gap of a selected width between adjacent each of said second plates, each oppositely disposed of said first and second plates forming an integrated circuit element to provide multiple integrated circuit elements on said single body, said integrated circuit elements being mechanically joined by said body.

2. A circuit as set forth in claim 1 wherein said body is ceramic.

3. A circuit as set forth in claim 1 wherein each of said circuit elements is a capacitor.

4. A circuit as set forth in claim 3 wherein one of said first and second plates is opposite three of the other of said first and second plates to form three circuit elements.

5. A circuit as set forth in claim 1 wherein first, second and third of said first plates are opposite a first of said second plates to provide first, second and third circuit elements, said third of said first plates is opposite a second of said second plates to provide a fourth circuit element, said circuit elements being connected to form a T schematic diagram and having two legs, said first and second circuit elements being in series with one another and said third and fourth circuit elements being in series with one another in said legs.

6. A circuit as set forth in claim 1 wherein one of said first plates is opposite to one of said second plates to form a first circuit element, a second of said first plates is opposite one of said second plates to form a second circuit element and a third of said first plates are opposite three of said second plates to form third, fourth and fifth circuit elements connected in a pie network with said second and fourth circuit elements connected at the ends of said pie network.

7. A circuit as set forth in claim 1 wherein each of said first plates is opposite one of said second plates to provide a schematic diagram of three parallel capacitors that are not connected to one another.

8. A circuit as set forth in claim 1 wherein one of said first and second plates is opposite three of the other of said first and second plates to provide three capacitors electrically connected in parallel with one another.

9. A circuit as set forth in claim 1 wherein first, second and third of said first plates are opposite first and second of said second plates to provide first and second circuit elements, a first reactive element connected between said first and second of said first plates and a second reactive element connected between said second and third of said first plates to form a schematic diagram having one side of said first circuit element connected to one side of said first reactive element and one side of said second circuit element connected between said first and second reactive elements.

10. A circuit as set forth in claim 9 wherein said reactive element is in the shape of a square wave having a straight horizontal first section, a second section that extends up from said first section, horizontally and down and connects to a straight horizontal third section.

11. A circuit as set forth in claim 10 wherein said reactive element is a resistor.

12. A circuit as set forth in claim 10 wherein said reactive element is an inductor.

13. A circuit as set forth in claim 1 wherein at least one of said first and second plates is opposite more than one of the other of said first and second plates to provide a common plate.

14. A multiple single layer passive integrated circuit comprising:

a single ceramic body having a selected shape, length and width, a plurality of thin, conductive first plates on a first face of said body, each of said first plates being of a selected width and a selected height with a gap of a preselected width between adjacent of said first plates, a plurality of thin, conductive second plates on an opposite face of said body, said second face being spaced from and parallel to said first face, said second plate being of a selected width and a selected length with a gap of a selected width between adjacent of each of said plates, each oppositely disposed of said first and second plates forming a capacitor to provide multiple capacitors on said single ceramic body, each of said first plates is opposite one of a second of said second plates to provide a schematic diagram of three parallel plates that are not electrically connected to one another.

* * * * *